(12) United States Patent
Wang et al.

(10) Patent No.: US 11,882,686 B2
(45) Date of Patent: Jan. 23, 2024

(54) CAPACITOR AND FORMING METHOD THEREOF, AND DRAM AND FORMING METHOD THEREOF

(71) Applicant: CHANGXIN MEMORY TECHNOLOGIES, INC., Hefei (CN)

(72) Inventors: Wenfeng Wang, Hefei (CN); Shuangshuang Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 280 days.

(21) Appl. No.: 17/374,969

(22) Filed: Jul. 13, 2021

(65) Prior Publication Data
US 2021/0343718 A1 Nov. 4, 2021

Related U.S. Application Data

(63) Continuation of application No. PCT/CN2021/078021, filed on Feb. 26, 2021.

(30) Foreign Application Priority Data

Mar. 2, 2020 (CN) .......................... 202010134587.0

(51) Int. Cl.
*H10B 12/00* (2023.01)
*H01L 49/02* (2006.01)

(52) U.S. Cl.
CPC ............. *H10B 12/30* (2023.02); *H01L 28/92* (2013.01); *H10B 12/03* (2023.02)

(58) Field of Classification Search
CPC ......... H01L 23/64; H01L 28/60; H01L 28/92; H10B 12/03; H10B 12/033; H10B 12/30
See application file for complete search history.

(56) References Cited

U.S. PATENT DOCUMENTS 7,709,342 B2 5/2010 Kim
8,124,978 B2 2/2012 Kim
(Continued)

FOREIGN PATENT DOCUMENTS

CN 108336068 A 7/2018
CN 108717936 A 10/2018
(Continued)

OTHER PUBLICATIONS

International Search Report in the international application No. PCT/CN2021/078021, dated May 31, 2021.
(Continued)

*Primary Examiner* — Nicholas J Tobergte
*Assistant Examiner* — Kevin Quinto
(74) *Attorney, Agent, or Firm* — Syncoda LLC; Feng Ma

(57) ABSTRACT

A method for forming a capacitor includes: providing a substrate with an electric contact portion; forming a supporting layer and a sacrificial layer which are alternately laminated on a surface of the substrate, wherein the topmost layer is a supporting layer; forming a capacitor hole penetrating through the supporting layer and the sacrificial layer and exposing the electric contact portion; forming a bottom electrode layer covering an inner surface of the capacitor hole; forming a protective layer covering a surface of the bottom electrode layer; removing the sacrificial layer, during which the bottom electrode layer being protected by the protective layer; removing the protective layer; and sequentially forming a capacitor dielectric layer and a top electrode layer.

15 Claims, 13 Drawing Sheets

(56) References Cited

U.S. PATENT DOCUMENTS

| | | | |
|---|---|---|---|
| 10,276,650 B2 | 4/2019 | Wu et al. | |
| 10,672,864 B2 | 6/2020 | Wu et al. | |
| 2006/0086952 A1 | 4/2006 | Kim | |
| 2006/0115954 A1 | 6/2006 | Shim | |
| 2010/0188795 A1 | 7/2010 | Kim | |
| 2012/0235279 A1* | 9/2012 | Seo | H01L 28/90 |
| | | | 257/532 |
| 2018/0190338 A1* | 7/2018 | Li | H01L 29/495 |
| 2018/0308923 A1 | 10/2018 | Wu et al. | |
| 2019/0206982 A1 | 7/2019 | Wu et al. | |
| 2019/0259938 A1* | 8/2019 | Yang | H10N 50/10 |
| 2020/0083317 A1 | 3/2020 | Huang et al. | |

FOREIGN PATENT DOCUMENTS

| | | |
|---|---|---|
| CN | 108735744 A | 11/2018 |
| CN | 208271885 U | 12/2018 |
| CN | 110707084 A | 1/2020 |

OTHER PUBLICATIONS

First Office Action of the Chinese application No. 202010134587.0, dated Feb. 14, 2022.

* cited by examiner

CAPACITOR AND FORMING METHOD THEREOF, AND DRAM AND FORMING METHOD THEREOF

CROSS-REFERENCE TO RELATED APPLICATIONS

The present application is a continuation of International Application No. PCT/CN2021/078021 filed on Feb. 26, 2021, which claims priority to Chinese Patent Application No. 202010134587.0 filed on Mar. 2, 2020. The disclosures of these applications are hereby incorporated by reference in their entirety.

BACKGROUND

Dynamic random-access memory (DRAM) is a common semiconductor storage device in a computer and is composed of a number of storage units. Each storage unit typically includes a transistor and a capacitor.

SUMMARY

The disclosure relates generally to the technical field of a storage, and more specifically to a capacitor and a forming method thereof, a DRAM and a forming method thereof.

Various embodiments of the present disclosure provide a capacitor and a forming method thereof, a DRAM and a forming method thereof, which can improve the performance of the capacitor.

In an aspect, a method for forming a capacitor is provided. The method for forming a capacitor can include: a substrate is provided with an electric contact portion being formed in the substrate; a supporting layer and a sacrificial layer which are alternately laminated are formed on a surface of the substrate, in which the topmost layer is a supporting layer; a capacitor hole penetrating through the supporting layer and the sacrificial layer and exposing the electric contact portion is formed; a bottom electrode layer covering an inner surface of the capacitor hole is formed, in which the bottom electrode layer connects to the electric contact portion; a protective layer covering a surface of the bottom electrode layer is formed; the sacrificial layer is removed, during which the bottom electrode layer is protected by the protective layer; the protective layer is removed; and a capacitor dielectric layer and a top electrode layer are sequentially formed on an inner surface and an outer surface of the bottom electrode layer and a surface of the supporting layer.

The technical solution of the examples of the disclosure further provides a capacitor formed by the above method.

The technical solution of the examples of the disclosure further provides a method for forming a DRAM, including that: a plurality of capacitors distributed in an array is formed by any one of the above methods.

The technical solution of the examples of the disclosure further provides a DRAM, including a plurality of the above capacitors arranged in an array.

DETAILED DESCRIPTION

In order to improve the integration level of capacitors, the capacitor is commonly designed in a vertical shape. By increasing the height of the capacitor, a capacitance value per unit area is increased.

With the continuous development of semiconductor technologies, performance requirements for the capacitor in a semiconductor integrated circuit become higher and higher. For example, it is desirable to form more capacitors in the limited area and improve the integration level of the capacitors. An improved integration level of capacitors can improve the integration level of a dynamic memory.

Figure 1A:
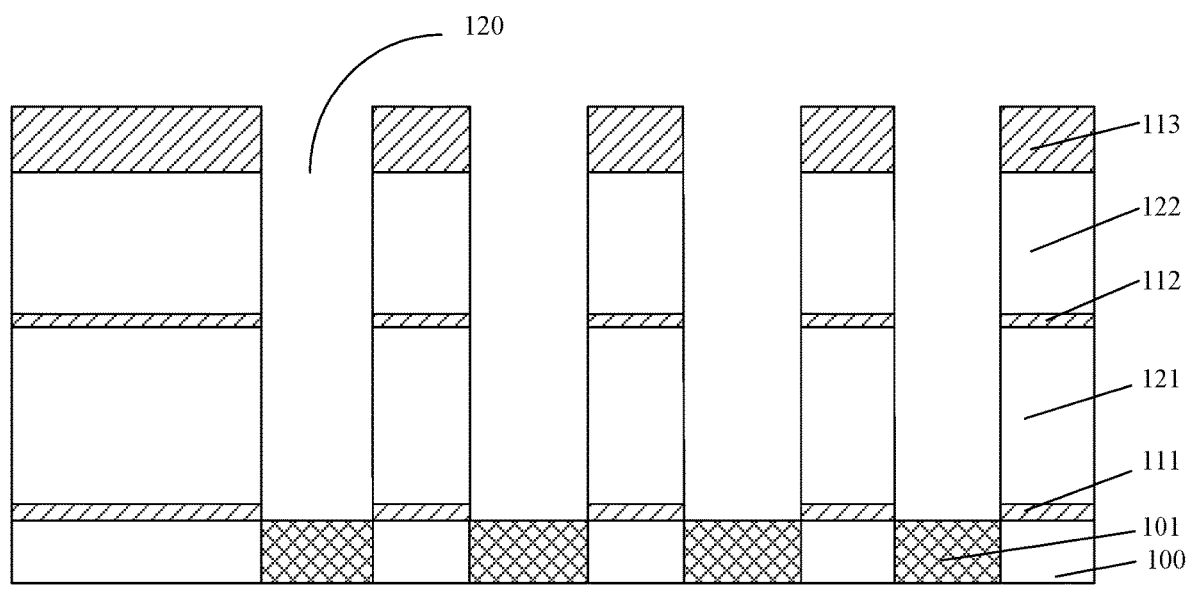
FIG. 1A is a first schematic structure diagram of a procedure for forming a capacitor according to some embodiments of the disclosure.
Figure 1B:
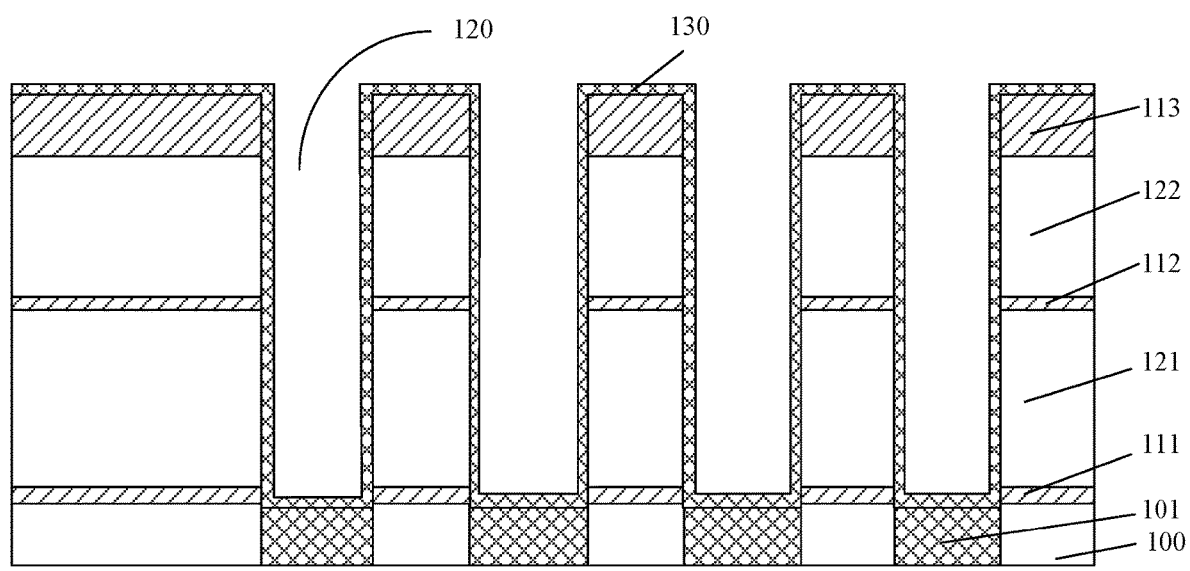
FIG. 1B is a second schematic structure diagram of a procedure for forming a capacitor according to some embodiments of the disclosure.
Figure 1C:
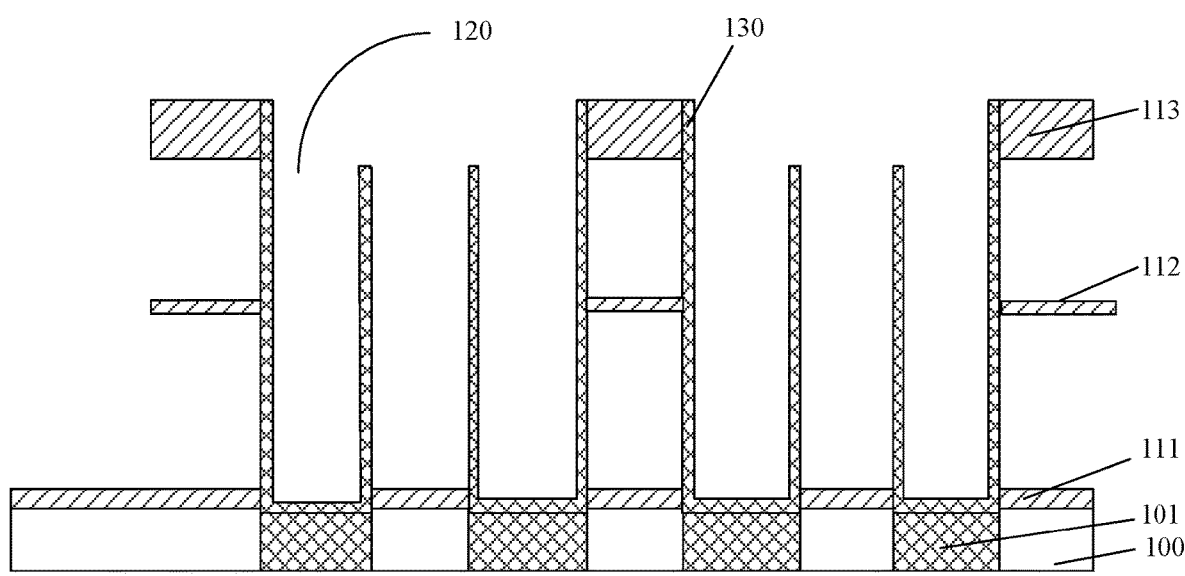
FIG. 1C is a third schematic structure diagram of a procedure for forming a capacitor according to some embodiments of the disclosure.

Referring to FIG. 1A to FIG. 1C, schematic diagrams of a procedure for forming a capacitor according to an example of the disclosure are shown.

Referring to FIG. 1A, a substrate 100 is provided, in which an electric contact portion 101 is formed in the substrate 100. A first supporting layer 111, a first sacrificial layer 121, a second supporting layer 112, a second sacrificial layer 122 and a third supporting layer 113 are sequentially formed on the substrate 100. A capacitor hole 120 located on a surface of the electric contact portion 101 is formed by etching.

Referring to FIG. 1B, a bottom electrode layer 130 is formed on an inner wall of the capacitor hole.

Referring to FIG. 1C, the third supporting layer 113 and the second supporting layer are etched to form an etching window, and the second sacrificial layer 122 and the first sacrificial layer 121 are removed; and then a capacitor dielectric layer and a top electrode layer (not shown in figures) are sequentially deposited on a surface of the bottom electrode layer 130.

The performance of the capacitor formed by the above method can be further improved.

Failures often occur in the capacitor formed by some methods, thereby resulting in a decrease in the reliability of the DRAM.

The inventors of the present disclosure have recognized that a significant reason of the capacitor failure is the problems of oxidation and deformation of a bottom polar plate of the capacitor. The inventors further studied and found that since in the related art, after the capacitor hole is formed, the bottom polar plate is formed first, and then the etching window of the third supporting layer and the second supporting layer is opened through a hard mask layer, thereby removing the first sacrificial layer and the second sacrificial layer. In procedures of etching the hard mask layer and removing each sacrificial layer, a bottom electrode is in an exposed state, thus readily to be oxidized and deform in etching procedures, and finally the performance of the formed capacitor is affected.

To solve the above problems, various embodiments of the present disclosure provide a new capacitor and a forming method thereof, as well as a DRAM and a forming method thereof.

The examples of the methods for forming a capacitor and a DRAM provided by the disclosure will be described below in detail in combination with the accompanying drawings.

Figure 2:
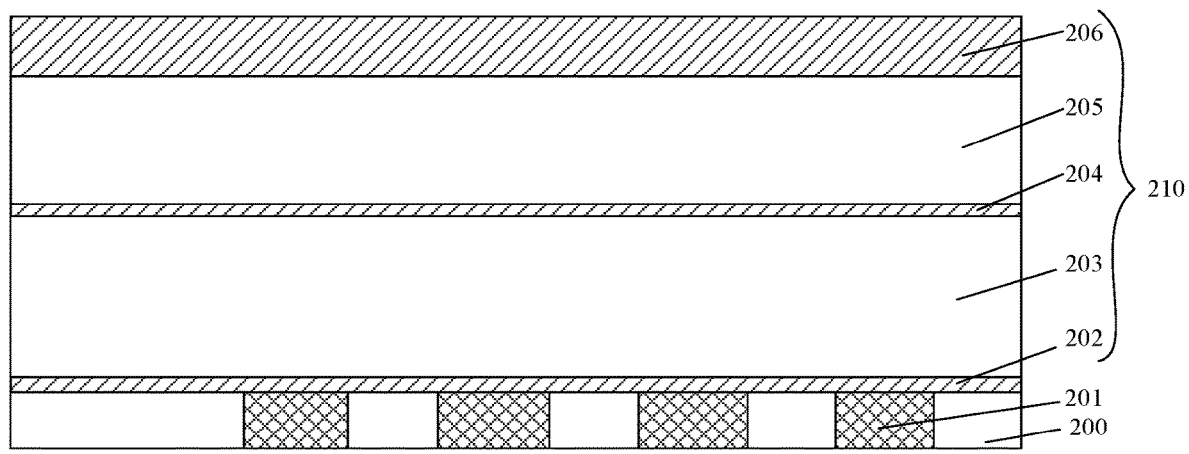
FIG. 2 is a fourth schematic structure diagram of a procedure for forming a capacitor according to some embodiments of the disclosure.

Referring to FIG. 2, a substrate 200 is provided, in which an electric contact portion 201 is formed, and a dielectric layer 210 is formed on a surface of the substrate 200. The dielectric layer 210 includes alternately laminated supporting layers and sacrificial layers.

Structures such as a word line, a bit line, a transistor, an isolation structure, and the like (not shown in figures) may also be formed in the substrate 200. The substrate 200 may include a semiconductor layer and a plurality of dielectric layers located on a surface of the semiconductor layer. The electric contact portion 201 is located in the top dielectric layer. The dielectric layer is a silicon nitride layer.

The dielectric layer 210 may be formed on the surface of the substrate 200 by a deposition process such as an atomic layer deposition process, a chemical vapor deposition process, or the like. It is to be noted that the dielectric layer 210 includes the sequentially alternately laminated supporting layers and sacrificial layers. The number of the supporting layer is greater than that of the sacrificial layer. The bottom material layer and the top material layer in the laminated structure composed of the sacrificial layers and the supporting layers are both supporting layers. The numbers of the supporting layers and the sacrificial layers may be set as required and is not limited by the specific example.

In the specific example, the dielectric layer 210 includes a first supporting layer 202 formed on the surface of the substrate 200, a first sacrificial layer 203 located on a surface of the first supporting layer 202, a second supporting layer 204 located on a surface of the first sacrificial layer 203, a second sacrificial layer 205 located on a surface of the second supporting layer 204, and a third supporting layer 206 located on a surface of the second sacrificial layer 205. The materials of the first supporting layer 202, the second supporting layer 204, and the third supporting layer 206 includes silicon nitride, and materials of the first sacrificial layer 204 and the second sacrificial layer 205 include silicon oxide. In other specific examples, the number of the supporting layers and that of the sacrificial layers may also be increased, thereby increasing a height of a capacitor and further increasing a capacitance value of the capacitor. The number of the supporting layers may be suitably reduced, for example, including only the first supporting layer 202 and the second supporting layer 204.

Figure 3:
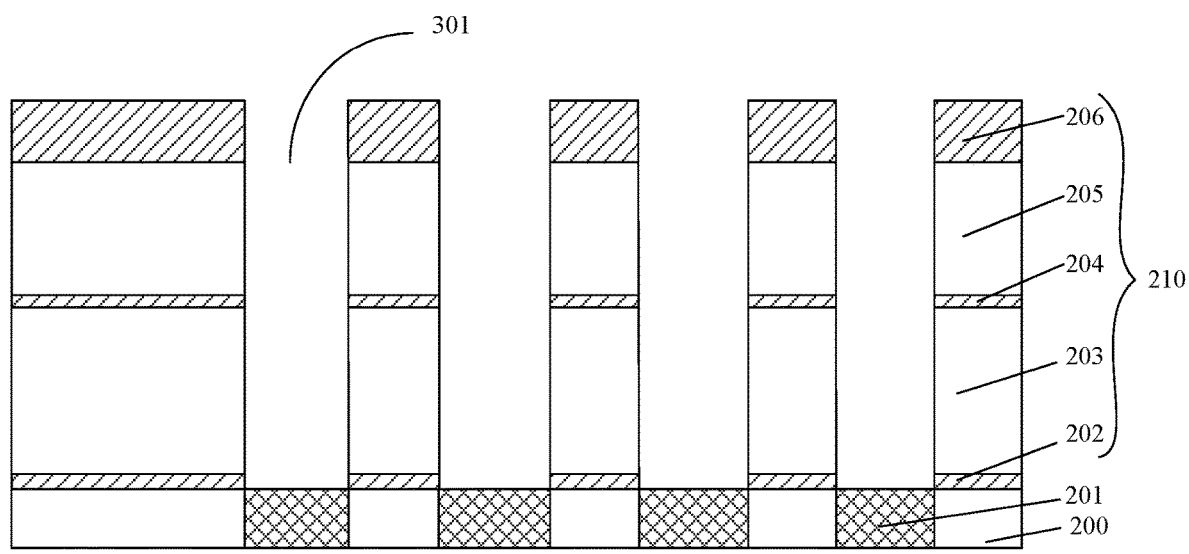
FIG. 3 is a fifth schematic structure diagram of a procedure for forming a capacitor according to some embodiments of the disclosure.

Referring to FIG. 3, a capacitor hole 301 penetrating through the supporting layers and the sacrificial layers and exposing the electric contact portion 201 is formed.

A method for forming the capacitor hole 301 includes the following steps. A graphical mask layer defining the position and the size of the capacitor hole is formed on a surface of the third supporting layer 206. By taking the patterned mask layer as a mask, the third supporting layer 206, the second sacrificial layer 205, the second supporting layer 204, the first sacrificial layer 203 and the first supporting layer 202 are sequentially etched until reaching the surface of the electric contact portion 201 to form the capacitor hole 301. In the case of having a plurality of electric contact portions 201, in the example, a plurality of the capacitor holes 301 is correspondingly formed.

Figure 4:
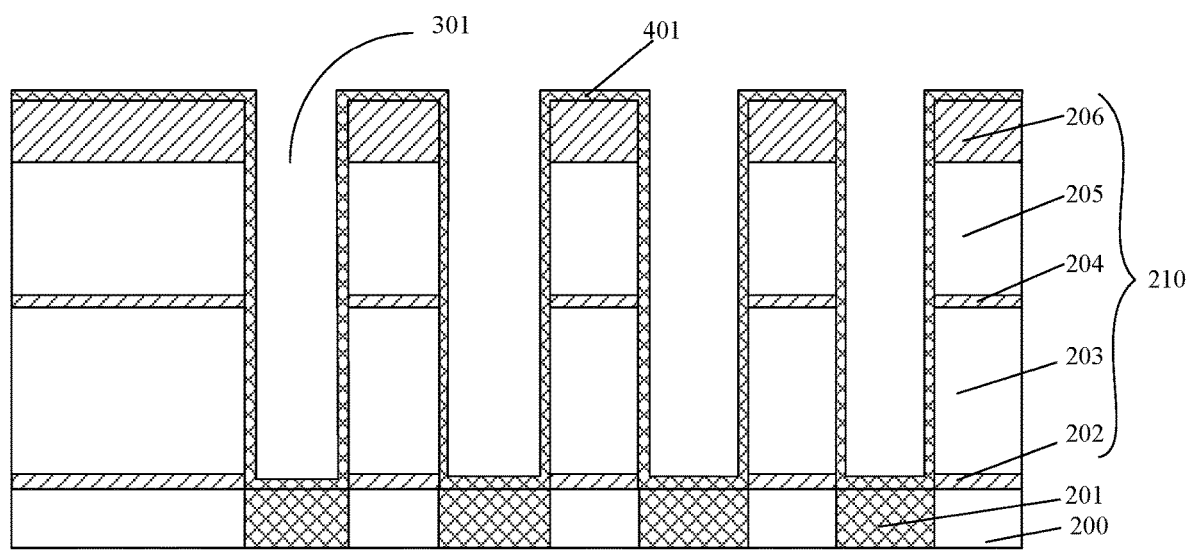
FIG. 4 is a sixth schematic structure diagram of a procedure for forming a capacitor according to some embodiments of the disclosure.

Referring to FIG. 4, a bottom electrode layer 401 covering an inner surface of the capacitor hole 301 is formed, and the bottom electrode layer 401 is connected to the electric contact portion 201.

The bottom electrode layer 401 may be formed by a deposition process such as an atomic layer deposition process, a physical vapor deposition process, or a plasma vapor deposition process. In the specific example, the bottom electrode layer 401 covers the sidewall and the bottom of the capacitor hole 301 and the top surface of the third supporting layer 206. The material of the bottom electrode layer 401 includes a metal material such as titanium nitride, tantalum nitride, copper or tungsten.

Figure 5:
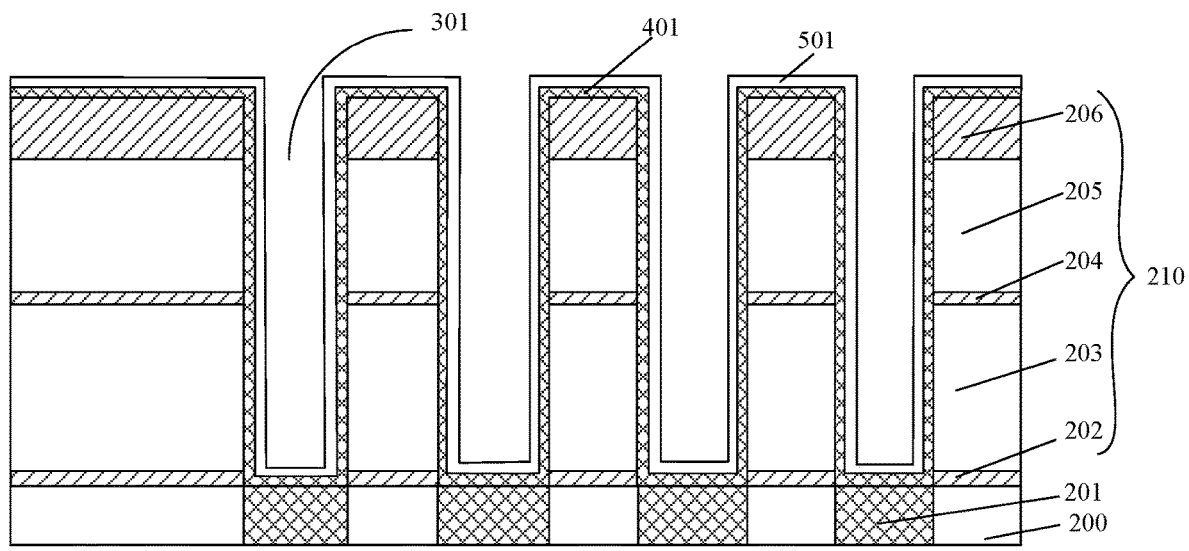
FIG. 5 is a seventh schematic structure diagram of a procedure for forming a capacitor according to some embodiments of the disclosure.

Referring to FIG. 5, a protective layer 501 covering a surface of the bottom electrode layer 401 is formed.

The protective layer 501 is made of a dielectric material. In order to improve the covering ability of the protective layer 501 to the bottom electrode layer 401, the protective layer 501 may be formed by the atomic layer deposition process, so that the formed material of the protective layer 501 is relatively compact.

The protective layer 501 serves to protect the bottom electrode layer 401 in subsequent processes. The thickness of the protective layer 501 may be 8 nm to 12 nm, so that the protective layer 501 has a good protective effect.

In the example, the material of the protective layer 501 is the same as the material of each sacrificial layer and is silicon oxide. In other examples, the material of the protective layer 501 may be other dielectric material, such as a silicon nitride layer or a silicon oxynitride layer.

Figure 6:
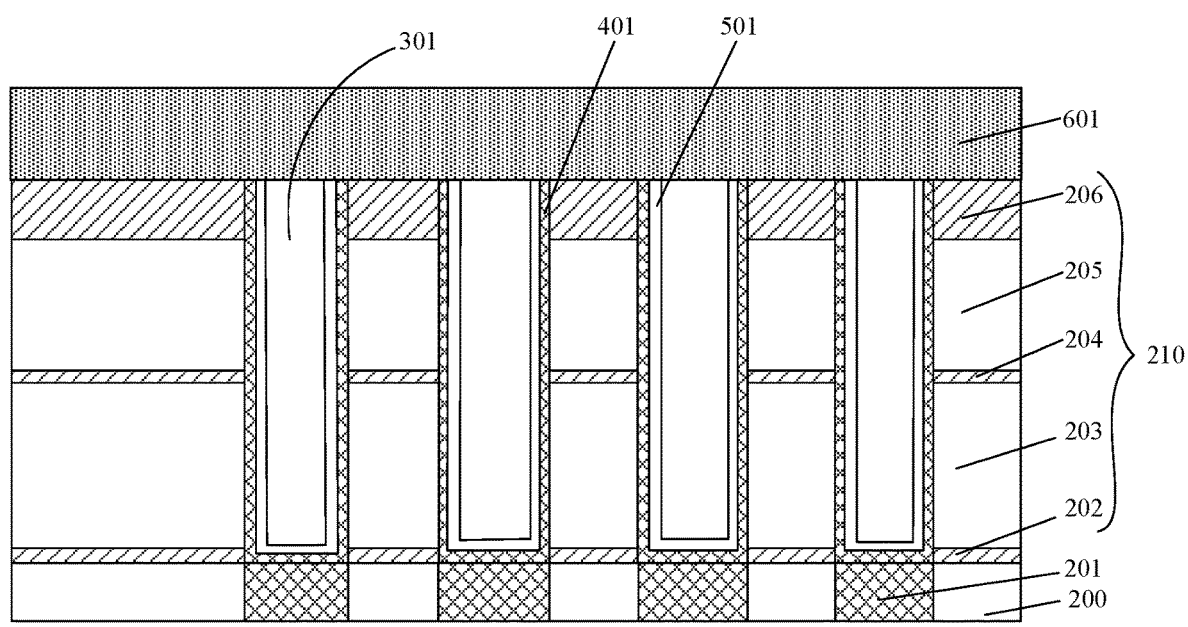
FIG. 6 is an eighth schematic structure diagram of a procedure for forming a capacitor according to some embodiments of the disclosure.

Referring to FIG. 6, the part of the bottom electrode layer 401 and the part of the protective layer 501 that covers the top surface of the third supporting layer 206 are removed to expose the top surface of the third supporting layer 206. A hard mask layer 601 is formed on the surface of the third supporting layer 206 located as the top layer.

The hard mask layer 601 may include at least one or more of a silicon nitride layer, a silicon oxide layer, an anti-reflection layer, or the like.

Figure 7:
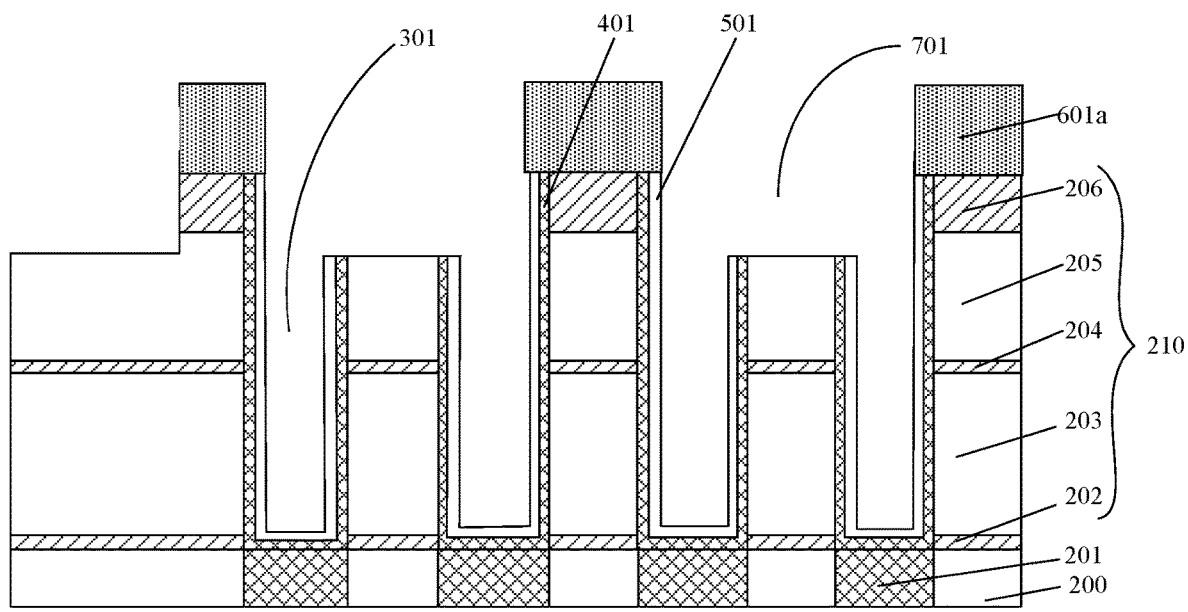
FIG. 7 is a ninth schematic structure diagram of a procedure for forming a capacitor according to some embodiments of the disclosure.

Referring to FIG. 7, the hard mask layer 601 is patterned to form a patterned hard mask layer 601*a*; and by taking the patterned hard mask layer 601*a* as a mask, the third supporting layer 206 as the top layer is etched to form an etching window 701 exposing the uppermost second sacrificial layer 205.

A method for forming the patterned mask layer 601*a* includes the following steps. A patterned photoresist layer is formed on a surface of the hard mask layer 601. By taking the patterned photoresist layer as a mask, the hard mask layer 601 is etched by a dry etching process to form the patterned hard mask layer 601a. In a procedure of etching to form the patterned mask layer 601a, when the capacitor hole 301 is exposed, the protective layer 501 can prevent the surface of the bottom electrode layer 401 from being damaged.

Figure 8:
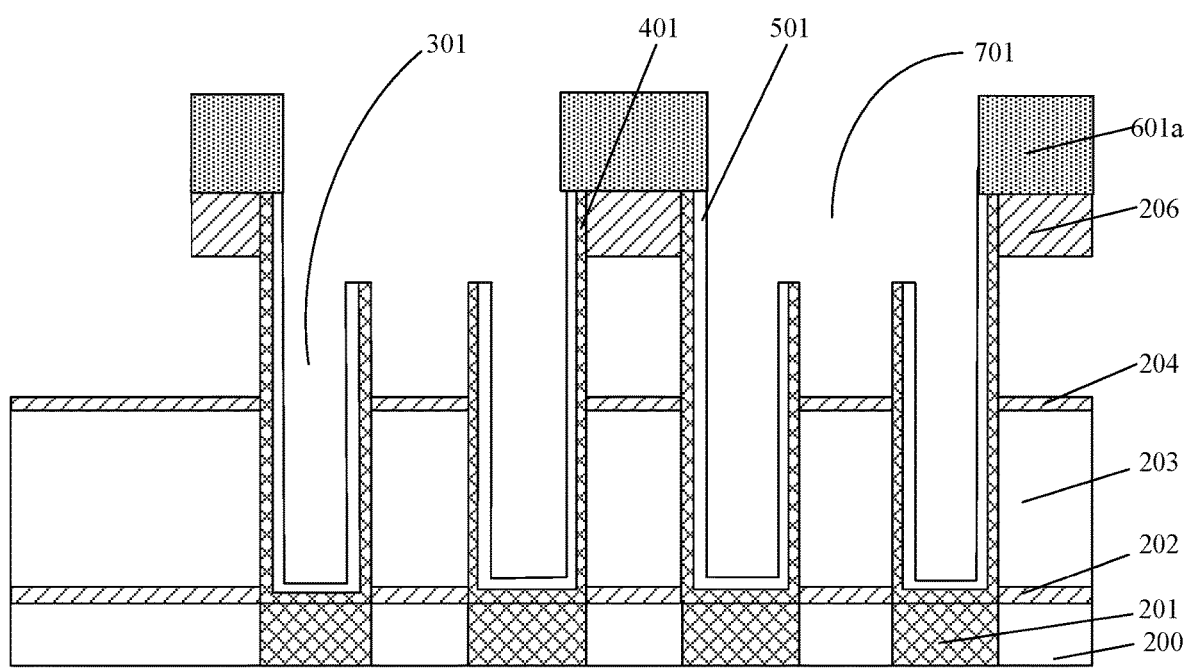
FIG. 8 is a tenth schematic structure diagram of a procedure for forming a capacitor according to some embodiments of the disclosure.

Referring to FIG. 8, the second sacrificial layer 205 on the uppermost layer is removed along the etching window 701.

The second sacrificial layer 205 is removed by a wet etching process. In the example, the material of the second sacrificial layer 205 is silicon oxide, and an HF solution with a higher concentration is used as an etching solution for the wet etching. If the HF solution is in direct contact with the bottom electrode layer 401, it causes the surface of the bottom electrode layer 401 to be oxidized. In the example, the surface of the bottom electrode layer 401 is covered with the protective layer 501 to prevent the bottom electrode layer 401 from being oxidized in a procedure of removing the second sacrificial layer 205.

In the example, the material of the protective layer 501 is silicon oxide, which is the same as the material of the second sacrificial layer 205. In the procedure of removing the second sacrificial layer 205 by etching, the protective layer 501 is also removed in the etching procedure. Since the density of the protective layer 501 is relatively high, the wet etching rate thereof is lower than that of the second sacrificial layer 205. By adjusting the thickness of the protective layer 501, the existence time of the protective layer 501 is prolonged in the procedure of removing the second sacrificial layer 205, and the protective effect of the protective layer 501 to the bottom electrode layer 401 is improved as much as possible. In the example, during removing the second sacrificial layer 205, the protective layer 501 is also completely removed. In other examples, after the second sacrificial layer 205 is removed, a part of the thickness of the protective layer 501 remains by increasing the thickness of the protective layer 501 so as to further protect the bottom electrode layer 401 in a subsequent process step.

In a procedure of removing the second sacrificial layer 205, centrifugal rotation may also be performed to improve the efficiency of removing the second sacrificial layer 205. The protective layer 501 covers the bottom electrode layer 401, so that deformation of the bottom electrode layer 401 under the action of a centrifugal force can be reduced or avoided to some extent.

In other examples, the protective layer 501 may also adopts a material different from that of the second sacrificial layer 205. For example, the material of the protective layer 501 is silicon nitride. In a procedure of removing the second sacrificial layer 205, the protective layer 501 is not removed. The protective layer 501 can always protect the surface of the bottom electrode layer 401 in the process of removing the second sacrificial layer 205 and the subsequent processes.

Figure 9:
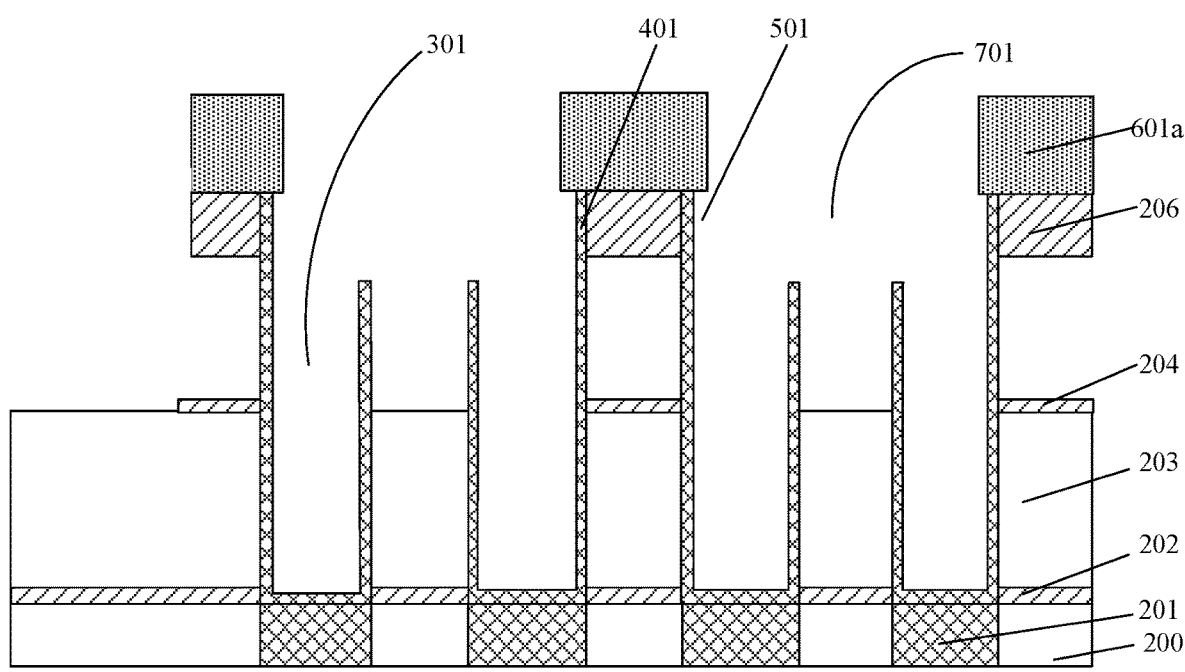
FIG. 9 is an eleventh schematic structure diagram of a procedure for forming a capacitor according to some embodiments of the disclosure.

Referring to FIG. 9, by taking the patterned hard mask layer 601a as a mask, the second supporting layer 204 is etched to expose the first sacrificial layer 203.

Figure 10:
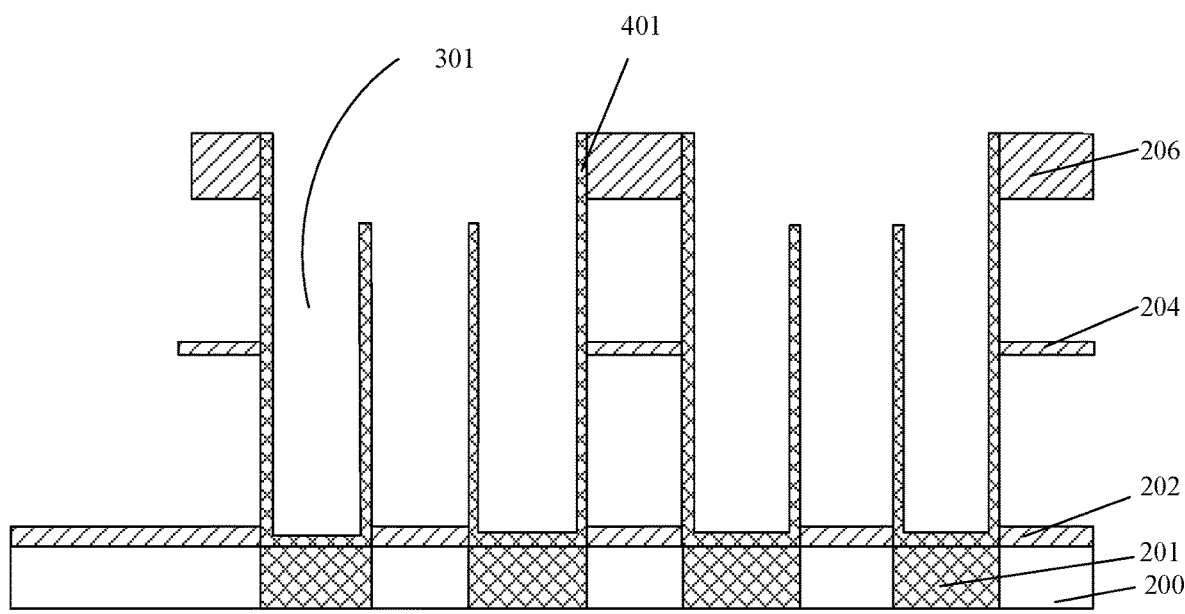
FIG. 10 is a twelfth schematic structure diagram of a procedure for forming a capacitor according to some embodiments of the disclosure.

Referring to FIG. 10, the first sacrificial layer 203 is removed.

The first sacrificial layer 203 may be removed by a wet etching process. In the example, since the protective layer 501 has been removed in the procedure of removing the second sacrificial layer 205, the bottom electrode layer 401 may no longer be protected in the procedure of removing the first sacrificial layer 203. The etching time of removing the first sacrificial layer 203 may be reduced by reducing the thickness of the first sacrificial layer 203, thereby reducing the influence of an etching solution on the bottom electrode layer 401. After the first sacrificial layer 203 is removed, the method further comprises a step in which the patterned hard mask layer 601a is removed.

In other examples, there may be four or more supporting layers and three or more sacrificial layers. The lower supporting layers and the lower sacrificial layers may be sequentially etched according to the method as described above, until all sacrificial layers are removed. In other examples, if a material of the protective layer is different from that of each sacrificial layer, the surface of the bottom electrode layer is always covered with the protective layer in the procedure of removing each sacrificial layer. The bottom electrode layer can be protected by the protective layer, so that the problems of oxidation of the surface and deformation are relieved. After all sacrificial layers are removed, the protective layer is then removed.

Figure 11:
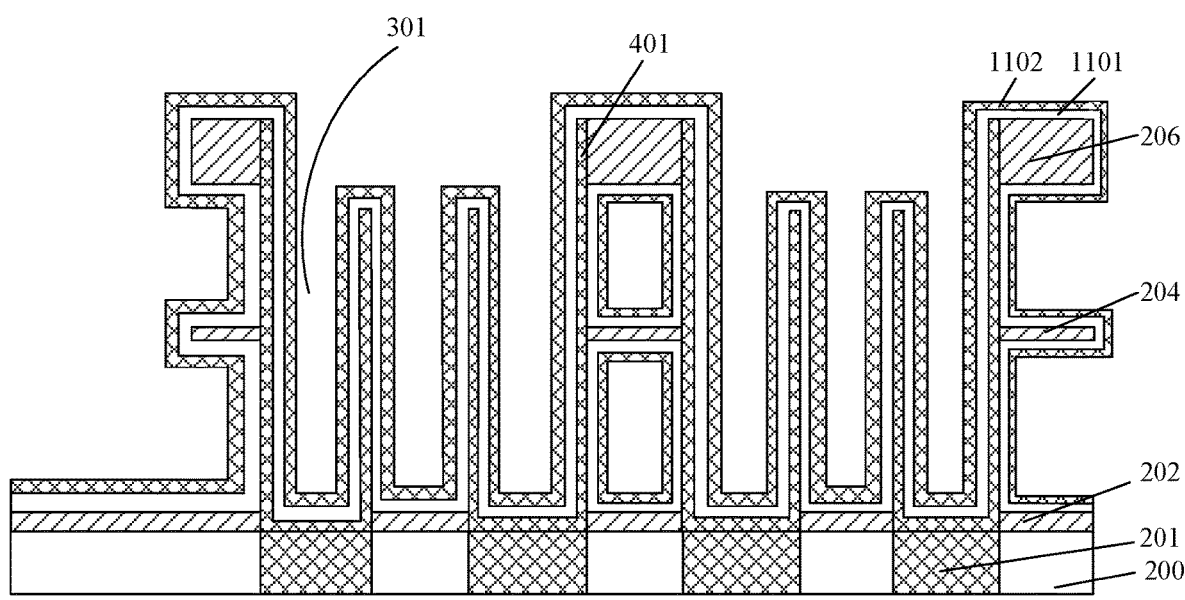
FIG. 11 is a thirteenth schematic structure diagram of a procedure for forming a capacitor according to some embodiments of the disclosure.

Referring to FIG. 11, a capacitor dielectric layer 1101 and a top electrode layer 1102 are sequentially formed on an inner surface and an outer surface of the bottom electrode layer 401 as well as on a surface of the supporting layer.

The material of the capacitor dielectric layer 1101 may be a high-K dielectric material so as to improve a capacitance value of capacitors of per unit area. The material includes one of $ZrO_x$, $HfO_x$, $ZrTiO_x$, $RuO_x$, $SbO_x$ and $AlO_x$ or a laminated layers formed by two or more selected from the group consisting of the above materials.

The top electrode layer 1102 covering an outer surface of the capacitor dielectric layer 1101 is formed by an atomic layer deposition process or a plasma vapor deposition process, a sputtering process, or the like. The top electrode layer 1102 includes a compound formed by one or two of metal nitride and a metal silicide, for example, titanium nitride, titanium silicide, nickel silicide, titanium-silicon nitride (TiSixNy), or other conductive materials.

The bottom electrode layer 401, the capacitor dielectric layer 1101 and the top electrode layer 1102 are constructed the capacitor.

A conductive filling layer (for example, a boron-doped silicon germanium layer) may also be subsequently formed on the surface of the top electrode layer 1102. The conductive filling layer fills up a gap between the upper electrode layers 1102.

In the method for forming the capacitor, the protective layer is formed on the surface of the bottom electrode layer, so that the bottom electrode layer can be protected in a procedure of removing the sacrificial layers, and the bottom electrode layer is protected in at least some of etching steps, thereby reducing the surface damage and deformation of the bottom electrode layer, and improving the performance of the formed capacitor.

The examples of the disclosure also provide a capacitor formed by adopting the above method, as shown in FIG. 11.

The capacitor includes a bottom electrode layer 401. The bottom electrode layer 401 is formed on a surface of a substrate 200, an electric connection portion 201 is formed in the substrate 200, and the bottom electrode layer 401 is connected to the electric connection portion 201. The cross section of the bottom electrode layer 401 is in a U-shape. A supporting layer is arranged on an outer side of a sidewall of the bottom electrode layer 401. The supporting layer includes a first supporting layer 202 connected to an outer side of the bottom of the sidewall of the bottom electrode layer, a second supporting layer 204 connected with an outer side of the middle of the sidewall of the bottom electrode layer 401 and a third supporting layer 206 connected with an outer side of the top of the sidewall of the supporting layer 401.

The capacitor further includes a capacitor dielectric layer 1101 covering a surface of the bottom electrode layer and a surface of each supporting layer, and a top electrode layer 1102 covering a surface of the capacitor dielectric layer 1101.

Compared with the capacitor formed by a method in the art, the capacitor in the examples of the disclosure is formed by the forming method in the above examples, the surface of the bottom electrode layer is protected by a protective layer in at least some of etching steps for forming the capacitor, so that the surface of the bottom electrode layer is not oxidized, the damage to the surface of the bottom electrode layer is reduced, and the deformation of the bottom electrode layer is also reduced, thereby improving the performance of the capacitor.

The examples of the disclosure also provide a method for forming a DRAM. Particularly, a plurality of capacitors distributed in an array is formed by the method for forming the capacitor in the above examples.

The examples of the disclosure also provide a DRAM, including a plurality of capacitors arranged in an array, in which the capacitors are formed by the method in the above examples.

The above are only preferred examples of the disclosure. It should be pointed out that those of ordinary skill in the art may further make multiple improvements and modifications without departing from the principle of the disclosure, and these improvements and modifications are also should be considered within the scope of protection of the disclosure.

The invention claimed is:

1. A method for forming a capacitor, comprising:
   providing a substrate with an electric contact portion;
   forming a supporting layer and a sacrificial layer which are alternately laminated on a surface of the substrate, wherein the topmost layer is a supporting layer;
   forming a capacitor hole penetrating through the supporting layer and the sacrificial layer and exposing the electric contact portion;
   forming a bottom electrode layer covering an inner surface of the capacitor hole, in which the bottom electrode layer connects to the electric contact portion;
   forming a protective layer covering a surface of the bottom electrode layer;
   removing the sacrificial layer, during which the bottom electrode layer being protected by the protective layer;
   removing the protective layer; and
   sequentially forming a capacitor dielectric layer and a top electrode layer on an inner surface and an outer surface of the bottom electrode layer and a surface of the supporting layer, and
   wherein the removing the sacrificial layer comprises:
   forming a hard mask layer on a surface of a top supporting layer;
   patterning the hard mask layer to form a patterned hard mask layer;
   etching the top supporting layer to form an etching window that exposes a top sacrificial layer by taking the patterned hard mask layer as a mask;
   removing the top sacrificial layer along the etching window by a wet etching process; and
   sequentially etching a lower supporting layer and removing a lower sacrificial layer until all sacrificial layers are removed.

2. The method for forming a capacitor of claim 1, wherein a thickness of the protective layer is 8 nm to 12 nm.

3. The method for forming the capacitor according to claim 1, wherein a material of the protective layer is different from that of the sacrificial layer, and the protective layer is removed after all sacrificial layers are removed.

4. The method for forming a capacitor of claim 1, wherein the hard mask layer is patterned by a dry etching process, and the supporting layer is etched by the dry etching process to form the etching window exposing the sacrificial layer.

5. The method for forming a capacitor of claim 1, wherein two or more supporting layers are formed.

6. The method for forming a capacitor of claim 1, wherein the protective layer is formed by an atomic layer deposition process.

7. The method for forming a capacitor of claim 6, wherein a material of the protective layer is same as a material of the sacrificial layer.

8. The method for forming a capacitor of claim 7, wherein the material of the protective layer is silicon oxide.

9. The method for forming a capacitor of claim 1, wherein the protective layer is removed while the top sacrificial layer is removed.

10. The method for forming a capacitor of claim 9, wherein in the wet etching process, an etching rate of the protective layer is smaller than an etching rate of the sacrificial layer.

11. The method for forming a capacitor of claim 1, wherein the sacrificial layer is removed by a centrifugal wet cleaning process.

12. The method for forming a capacitor of claim 11, wherein a solution used in the wet cleaning process is an HF solution.

13. A capacitor, formed by the method of claim 1.

14. A method for forming a dynamic random-access memory (DRAM), comprising: forming a plurality of the capacitors with the method of claim 1, distributed in an array.

15. A dynamic random-access memory (DRAM) formed with the method of claim 14, comprising the plurality of the capacitors distributed in the array.

* * * * *